(12) United States Patent
Rolfson et al.

(10) Patent No.: US 6,509,250 B2
(45) Date of Patent: *Jan. 21, 2003

(54) METHOD FOR CMOS WELL DRIVE IN A NON-INERT AMBIENT

(75) Inventors: J. Brett Rolfson, Boise, ID (US); Tyler A. Lowrey, Boise, ID (US); Fernando Gonzalez, Boise, ID (US); W. Richard Barbour, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/991,105

(22) Filed: Nov. 21, 2001

(65) Prior Publication Data

US 2002/0076870 A1 Jun. 20, 2002

Related U.S. Application Data

(63) Continuation of application No. 09/441,925, filed on Nov. 17, 1999, which is a continuation of application No. 08/587,403, filed on Jan. 17, 1996, now Pat. No. 6,004,868.

(51) Int. Cl.[7] ............................................. H01L 21/324
(52) U.S. Cl. ....................................... 438/471; 438/477
(58) Field of Search ................................. 438/471, 477, 438/795, 473, 223, 227, 402, 143, 310

(56) References Cited

U.S. PATENT DOCUMENTS

| | | | |
|---|---|---|---|
| 4,053,335 A | 10/1977 | Hu | 148/174 |
| 4,376,657 A | 3/1983 | Nagasawa et al. | 148/1.5 |
| 4,548,654 A | 10/1985 | Tobin | 148/1.5 |
| 4,622,082 A | 11/1986 | Dyson et al. | 148/33 |
| 4,851,358 A | 7/1989 | Huber | 437/10 |
| 5,094,963 A | 3/1992 | Hiraguchi et al. | 438/471 |
| 5,162,241 A | 11/1992 | Mori et al. | 438/473 |
| 5,296,411 A | 3/1994 | Gardner et al. | 437/238 |
| 5,409,563 A | 4/1995 | Cathey | 156/643 |
| 5,416,048 A | 5/1995 | Blalock et al. | 437/228 |
| 5,418,184 A | 5/1995 | Girisch | 437/135 |
| 5,419,804 A | 5/1995 | Ojha et al. | 156/643.1 |
| 5,445,975 A | 8/1995 | Gardner et al. | 437/10 |
| 5,478,762 A | 12/1995 | Chao | 437/34 |
| 5,587,325 A | 12/1996 | Comeau | 437/10 |
| 5,795,809 A | 8/1998 | Gardner et al. | 438/402 |
| 6,004,868 A | 12/1999 | Rolfson et al. | 438/471 |

*Primary Examiner*—Savitri Mulpuri
(74) *Attorney, Agent, or Firm*—Dorsey & Whitney LLP

(57) ABSTRACT

Disclosed is an improved CMOS fabrication method that allows an implanted well in a bare silicon wafer to be simultaneously, driven annealed and denuded in a single process step. More specifically, a single step drive-anneal-denude (DAD) process is accomplished using a non-inert ambient environment. The DAD process is accomplished in a combination argon/hydrogen ambient environment. This process causes the silicon wafer to roughen slightly and is followed by an oxidation step, that optionally takes place in a combination argon/oxygen ambient environment to smooth out the silicon surface. The oxidation step may also optionally act as a pad-oxide or screening oxide for subsequent fabrication.

6 Claims, 2 Drawing Sheets

METHOD FOR CMOS WELL DRIVE IN A NON-INERT AMBIENT

RELATED APPLICATION

This application is a continuation of U.S. application Ser. No. 09/441,925, filed Nov. 17, 1999, which is a is a continuation of U.S. application Ser. No. 08/587,403, filed Jan. 17, 1996, and issued as U.S. Pat. No. 6,004,868.

FIELD OF THE INVENTION

This invention relates to the fabrication of semiconductor devices and more specifically, to a new method for annealing and well drive of an implanted well in a CMOS device on a bare silicon wafer.

BACKGROUND OF THE INVENTION

Semiconductor manufacturing technology has advanced to the point where a single die may contain millions of active devices. Illustrative of this advancement is the fact that since the late 1960's there has been over a two-hundred-fold increase in functional density, and twenty-fold increase in speed of integrated circuits. In light of the direction and demands of semiconductor manufacturing CMOS is now the dominant integrated circuit technology.

In CMOS fabrication the silicon wafers are subjected to many elevated temperature steps in order to effect a variety of changes in the material properties of the wafer and fabricated device. One of the high temperature processes used in CMOS technology is ion implantation to drive in the wells used in the devices. Ion implantation has many advantages including more precise control of the number of impurity atoms introduced into the wafer substrate. Unfortunately ion implantation cannot be achieved without damage to the material structure of the target substrate.

Defects in the silicon substrate impact important functional parameters which can cause device failures by excessive leakage currents, etc. To restore the target material to its pre-ion-implantation condition, additional processing must be performed on the wafer. Each additional process step that is required subjects the wafer to an additional source of stress and potentially introduces new insults and injuries to the wafer and fabricated device. As the functional density and speed of integrated circuits increases, there is less ability for the wafers to tolerate functional imperfections introduced during fabrication and manufacture and still operate.

What is still needed is improved fabrication processes that allow better control of the stresses and exposures to a silicon substrate and reduces the total number of process steps required.

SUMMARY OF THE INVENTION

It is an object of the present invention to provide a CMOS well-drive process that allows annealing and denuding of the wafer at the same time.

It is another object to provide a better denuding zone and reduced silicon pitting.

It is a further object to provide a CMOS well-drive process that puts the silicon wafer in better condition for subsequent fabrication steps than the existing well-drive processes.

The present invention is an improved CMOS fabrication method that allows an implanted well in a bare silicon wafer to be simultaneously, driven annealed and denuded in a single process step. More specifically, a single step drive-anneal-denude (DAD) process is accomplished using a non-inert ambient environment. The DAD process is accomplished in a combination argon/hydrogen ambient environment. This process causes the silicon wafer to roughen slightly and is followed by an oxidation step that optionally takes place in a combination argon/oxygen ambient environment to smooth out the silicon surface. The oxidation step may also optionally act as a pad-oxide or screening oxide for subsequent fabrication.

One exemplary embodiment of the current invention concerns a method for denuding, annealing and well drive of an implanted well in CMOS fabrication on a bare silicon wafer comprising:

heating the wafer to a high temperature in the range from about 500.degree. to 700.degree. C. in an argon ambient environment;

annealing and driving the well into the wafer in an argon/hydrogen ambient environment under high temperature in the range from about 1100.degree. to 1250.degree. C.; and oxidizing the wafer under high temperature in the range from about 800.degree. to 1100.degree. C.

In a more specific exemplary embodiment, the argon/hydrogen ambient environment contains between 0.5 to 10% hydrogen.

In another more specific exemplary embodiment, the wafer is held at the desired temperature for a period of at least 10 hours during the step of oxidizing the wafer under high temperature.

In yet another more specific exemplary embodiment, the wafer is oxidized in an argon/oxygen ambient containing 1–20% oxygen.

One alternative exemplary embodiment comprises oxidizing the wafer under high temperature in the range from about 800.degree. to 1100.degree. C.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE PREFERRED EMBODIMENT

Figure 1:
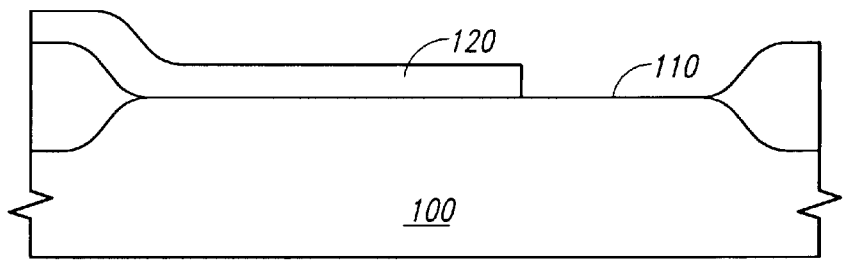
FIGS. 1 through 4 are schematic cross-sectional views of a silicon wafer illustrating the sequence of process steps for CMOS well-drive, annealing and denuding in a single step in a non-inert ambient.
Figure 2:
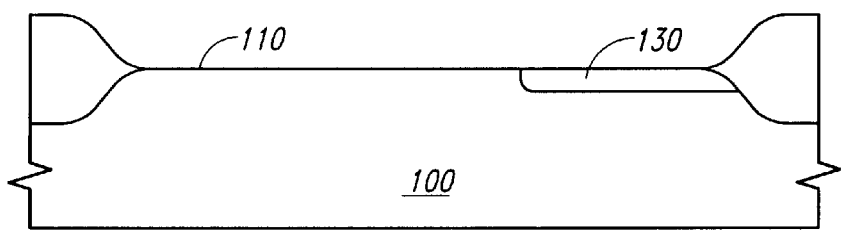

There are many options available for process flow in CMOS fabrication. A basic single-well CMOS process can be implemented in either p-well or n-well technology using eight masking steps. An n-well CMOS fabrication process will be used here to illustrate the process of the present invention, but the process can also be used in a p-well CMOS fabrication process.

Regions of opposite doping in CMOS fabrications are called wells or tubs. First a pattern for n-well 140 is laid down and defined by a photoresist mask 120 on surface 110 of wafer 100. N-well implant 130 is then implanted into exposed regions of wafer 100. Photoresist layer 120 is then removed from wafer surface 110. The application and removal of photoresist 120 as well as the implanting of n-well implant 130 are procedures that are well known in the art.

The implantation process is unable to place the n-well implant 130 ions deeply enough into the silicon of wafer 100, so these ions or impurities must be driven in to the appropriate depth during a subsequent high temperature cycle in order to form the necessary well 140. The drive-in step for n-well implant 130 is normally accomplished by an ion implantation process step.

Ion implantation has many advantages but unfortunately cannot be achieved without damage to the substrate material. In order to successfully fabricate devices, the damaged substrate regions must be restored to their pre-implantation condition and the implanted species must be electrically activated. To accomplish this restoration of semiconductor wafer substrate 100 in conventional processes, thermal processing after implantation must be performed to anneal the damaged regions and electrically activate the implanted ions. Specific minimum times and temperatures for this processing depend upon the type and amount of the implanted ion.

There is an alternative implantation process using what is known in the art as a MeV implanter. Although a MeV implanter can deliver the implant 130 ions deep enough, substrate 100 still needs to be annealed and the temperatures required for this annealing still cause some additional drive-in of implant 130 to occur. The advantage of using a MeV-type implanter is that drive times are significantly reduced from the 12 hours required in the conventional drive-in process.

It is accepted and well known with in the art that it is important that the steps used to anneal implantation damage be conducted in a neutral ambient environment, such as Ar or $N_2$. This is because dislocations which form during annealing can serve as nucleation sites for oxidation induced stacking faults if oxidation (when the annealing is performed in an oxygen ambient) is carried out simultaneously with the anneal.

It is useful if oxygen precipitates are not present at wafer surface 110. The procedure utilized to prevent oxygen precipitates from forming near wafer surface 110 involves creation of a zone that contains less interstitial oxygen than required to form oxygen precipitates. Removal of device degrading impurities such as the oxygen precipitates is referred to as gettering, in which an appropriate material is used to getter, or remove the undesirable impurity. Subjecting the wafer to a high temperature step which causes reduced oxygen concentration in the region near the surface of the wafer is referred to as denuding and the region where this has been accomplished is referred to as a denuded zone.

Figure 3:
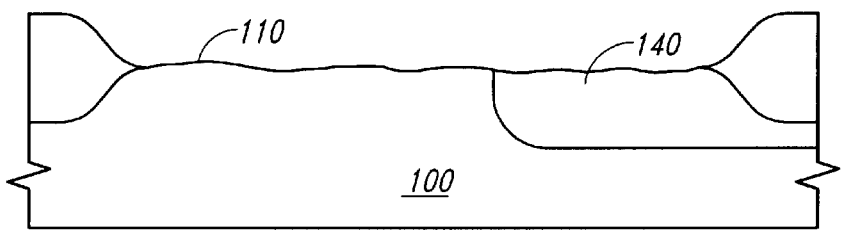
Figure 4:
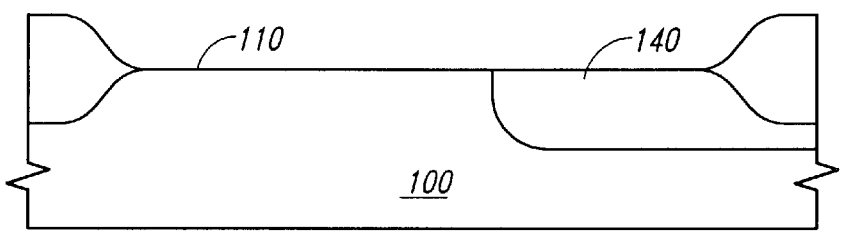

With the process of this invention, n-well implant 130 can be simultaneously, driven, annealed and denuded in a single process step. With this single step drive-anneal-denude (DAD) process, n-well implant 130 is driven in an argon/hydrogen ambient environment, which is by definition non-inert. After the DAD process, implant 130 is transformed into actual n-well 140, as seen in FIG. 3, which occupies a larger site in wafer 100 than did pre-drive n-well implant 130. The argon/hydrogen ambient used in this method can contain from 0.5 to 10% hydrogen, with 5% being the preferred mixture. This method causes silicon wafer surface 110 to roughen slightly, therefore the DAD step is followed by an oxidation step to smooth out roughened silicon surface 110, as shown in FIG. 4.

The argon/hydrogen mixture for the ambient environment is what makes it possible to accomplish the DAD in the single step. The DAD process, utilizing the non-inert argon/hydrogen ambient allows the gettering of undesirable impurities simultaneous with the drive process because of the hydrogen's reactiveness. This three-operation DAD process in combination with a post-DAD oxidation step puts the silicon in better condition for subsequent fabrication steps. For some process sequences, the DAD process in combination with a post-DAD oxidation allows the smoothing, post-DAD oxidation to become the pad oxide or screening oxide for subsequent fabrication steps.

A typical furnace that can be employed in the DAD process is an ASM Advance 400 Vertical Furnace (A/400) available from ASM-America (Tempe, Ariz.). This unit consists of a staging area where cassettes of wafers are placed and a wafer handling unit which removes the wafers from the cassette and places them into a "wafer boat" of the furnace. The A/400 also includes a mechanism for raising and and a means for controlling the temperature of the quartz tube. The furnace further includes a means for introducing known quantities of gases into the tube. Although this is presently the preferred furnace for the DAD process, any appropriate apparatus that can provide the requirements necessary for the DAD process could be used and the invention is not meant to be limited by the use of a particular furnace.

In a typical or exemplifying furnace cycle in the A/400, a cassette or multiple cassettes of wafers are placed onto the wafer staging area, the pick-and-place unit then takes the wafers to be processed and loads them into the quartz boat. The quartz boat is oriented such that it's long axis is in a vertical position and the wafers sit in a substantially horizontal position. Once loaded, the boat begins to move slowly upward into the tube while the tube is being purged with nitrogen or an inert gas, such as argon. The temperature of the tube is kept an idle temperature of approximately 650.degree. C. One the boat is pushed fully into the furnace, the bottom portion of the boat acts to seal the mouth of the tube. The wafers are allowed to stabilize at the idle temperature for approximately 15–30 minutes. Then the temperature is increased or ramped up at a rate of 4–8 degrees per minute, still under the nitrogen or inert gas purge, to the required temperature for the first process step for the DAD process. The desired gases for the first DAD process step are then introduced into the tube via mass flow controllers.

In the instance of the preferred embodiment of the DAD process, the first process gases are hydrogen and argon. After processing for the required time, the process gases are purged with either nitrogen or inert purge gas or a mixture thereof. The temperature can then be ramped to a second process temperature, and different process gases can be introduced, for example an oxygen/argon mixture for the post-DAD oxidation step to help oxidize and smooth the silicon surface of processed wafer 100.

Figure 5:
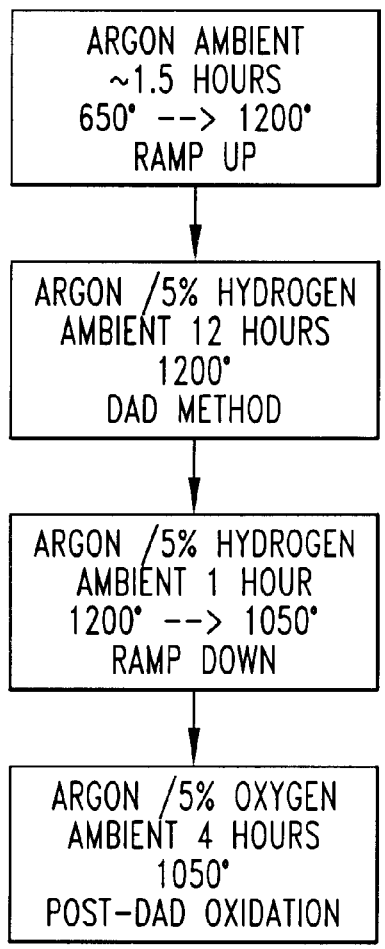
FIG. 5 is a flow chart of the steps for the single step combination well-drive, annealing and denuding method of this invention in a non-inert ambient with only a post-DAD oxidation.

The process furnace cycle for the DAD process for a semiconductor wafer includes four steps, including the post DAD oxidation. The method steps for the DAD process are illustrated as a flow chart in FIG. 5. In the first step of the process wafer 100 is heated for approximately 1.5 hours from 650.degree. to 1200.degree. C. in preferably an argon ambient environment, however it would also be possible to do this step in the argon/hydrogen mixture ambient environment. This is the ramp step to raise wafer 100 to the necessary temperature for the DAD step. Next wafer 100 is held at 1200.degree. C. for 12 hours in the argon/hydrogen ambient environment, that is preferably 5% hydrogen. This is the step in which the combination well-drive, annealing and denuding of the wafer, what we have termed DAD is accomplished. The third step consists of decreasing, or ramping down the temperature of wafer 100 in the same argon/hydrogen ambient environment from 1200.degree. to 1050.degree. C. over a time of approximately 1 hour. The last step consists of holding wafer 100 at 1050.degree. C. for approximately 4 hours in an oxidizing environment.

Preferably the oxidizing environment is an argon/oxygen ambient environment, that is approximately 5% oxygen. This last step is the post-DAD oxidation step that smoothes out the slightly roughened surface of wafer 100 resulting from the DAD process. This post-DAD oxidation step, however could also be performed by any of the conventional oxidation methods that are well known in the art. Examples of conventional oxidation methods include, but are not limited to, steam oxidation, 100% oxygen, ozone/oxygen and ozone/oxygen/steam methods. For some fabrication sequences, this post-DAD oxidation allows the smoothing, post-DAD oxidation to effectively act as the pad oxide or screening oxide for subsequent fabrication steps.

Figure 6:
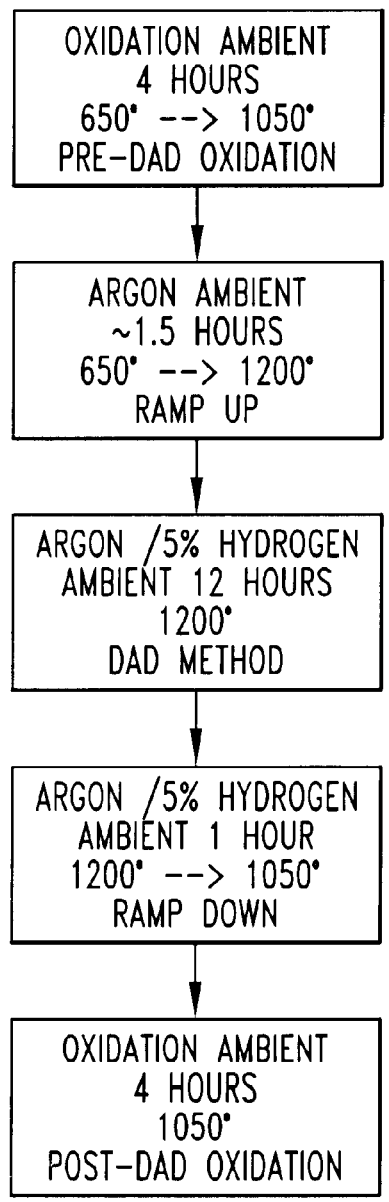
FIG. 6 is a flow chart of the steps for the single step combination well-drive, annealing and denuding method of this invention in a non-inert ambient with both a pre- and post-DAD oxidation.

In another embodiment of this invention an oxidation step can be performed prior to introducing the argon/hydrogen ambient environment process step. This embodiment can be used when it is desirable not to have the silicon of wafer 100 exposed directly to the hydrogen, to further improve smoothness of wafer 100 or for other fabrication advantages. The method steps for this embodiment of the DAD process are illustrated as a flow chart in FIG. 6.

This process is unique and distinct because the hydrogen percentage is diluted in the argon to such an extent that the flammability of the hydrogen is reduced and the furnace equipment requirements for safety is reduced.

The DAD process of this invention has the advantages of providing a better denuding zone and reduced silicon pitting as well as having lower measure of the number of undesirable defects that have been introduced during processing, or LPD (Light Point Defects) density. The argon/hydrogen combination for the ambient environment provides an optimized annealing, which is then additionally smoothed by the post-DAD oxidation step. An additional advantage of this invention is that in some fabrication procedures, the smoothing, post-DAD oxidation can also act as a pad oxide or screening oxide for subsequent fabrication steps, thus allowing for the elimination of a separate pad or screening oxide step.

It will therefore be understood that modifications and variations are possible without departing from the scope of the invention as expressed in the following claims.

We claim:

1. A method for denuding, annealing and well drive of an implanted well in CMOS fabrication on a bare silicon wafer comprising:

a) oxidizing the wafer under high temperature in the range from about 8000 to 1100° C.;

b) heating the wafer to a high temperature in the range from about 500° to 700° C. in an argon ambient environment;

c) annealing and driving the well in to the wafer in an argon hydrogen ambient environment under high temperature in the range from about 1100° to 1250° C., wherein the argon/hydrogen ambient environment contains between 0.5 to 10% hydrogen;

d) oxidizing the wafer under high temperature in the range from about 800° to 1100° C. in an argon/oxygen environment.

2. The method of claim 1 where in step (a) the wafer is heated from room temperature to the desired temperature and maintained at the desired temperature for a period of at least 1 hour.

3. The method of claim 1 where in step (c) the wafer is held at the desired temperature for a period of at least 10 hours.

4. A method for denuding, annealing and well drive of an implanted well in CMOS fabrication on a bare silicon wafer and subsequently forming a pad-oxide layer comprising:

a) rapidly heating the wafer to a high temperature in the range from about 500° to 700° C. in an argon ambient environment;

b) annealing and driving the well in to the wafer in an argon hydrogen ambient environment under high temperature in the range from about 1100° to 1250° C., wherein the argon/hydrogen ambient environment contains between 0.5 to 10% hydrogen;

c) oxidizing the wafer under high temperature in the range from about 800° to 1100° C. in an argon/oxygen environment to getter and smooth the wafer surface subsequent to annealing and driving the well into the argon/hydrogen ambient environment and simultaneously form a pad-oxide layer on the wafer.

5. The method of claim 4 where in step (a) the wafer is heated from room temperature to the desired temperature and maintained at the desired temperature for a period of at least 1 hour.

6. The method of claim 4 where in step (c) the wafer is held at the desired temperature for a period of at least 10 hours.

* * * * *

UNITED STATES PATENT AND TRADEMARK OFFICE
CERTIFICATE OF CORRECTION

PATENT NO. : 6,509,250 B2
DATED : January 21, 2003
INVENTOR(S) : J. Brett Rolfson et al.

It is certified that error appears in the above-identified patent and that said Letters Patent is hereby corrected as shown below:

<u>Title page,</u>
Item [57], ABSTRACT,
Line 3, "simultaneously, driven annealed and denuded" should read -- simultaneously driven, annealed and denuded --

<u>Column 1,</u>
Line 7, "which is a is a" should read -- which is a --
Line 66, "simultaneously, driven annealed and denuded" should read -- simultaneously driven, annealed and denuded --

<u>Column 2,</u>
Line 15, "500.degree. to 700.degree. C." should read -- 500° to 700° C. --
Line 20, "1100.degree." should read -- 1100° --
Line 21, "1250.degree. C.; and" should read -- 1250° C.; and --
Line 23, "800.degree. to 1100.degree. C." should read -- 800° to 1100° C. --

<u>Column 3,</u>
Line 41, "well known with in the" should read -- well known within the --
Line 44, "or N.sub.2." should read -- or $N_2$. --
Line 62, "be simultaneously, driven, annealed and denuded" should read -- be simultaneously driven, annealed and denuded --

<u>Column 4,</u>
Line 28, "and and a means for" should read -- and lowering the wafer boat into a heat quartz tube and a means for --
Line 40, "such that it's long axis" should read -- such that its long axis --
Line 45, "kept an idle temperature" should read -- kept at an idle temperature --
Line 46, "650.degree. C. One the" should read -- 650° C. Once the --
Line 61, "introduced, for example an" should read -- introduced; for example, --

<u>Column 5,</u>
Line 2, "from 650.degree. to 1200.degree. C. in" should read -- from 650° to 1200° C. in --
Line 7, "held at 1200.degree. C. for" should read -- held at 1200° C. for --
Line 10, "have termed DAD is" should read -- have termed DAD, is --
Line 11, "decreasing, or" should read -- decreasing or --

UNITED STATES PATENT AND TRADEMARK OFFICE
CERTIFICATE OF CORRECTION

PATENT NO.    : 6,509,250 B2
DATED         : January 21, 2003
INVENTOR(S)   : J. Brett Rolfson et al.

It is certified that error appears in the above-identified patent and that said Letters Patent is hereby corrected as shown below:

Column 5, cont'd.,
Line 13, "from 1200.degree. to" should read -- from 1200° to --
Line 14, "1050.degree. C. over" should read -- 1050° degree C. over --
Line 15, "1050.degree. C. for" should read -- at 1050° C. for --

Column 6,
Line 10, "from about 8000 to 1100°. C.;" should read -- from about 800° to 1100° C.; --

Signed and Sealed this

Twenty-sixth Day of October, 2004

JON W. DUDAS
*Director of the United States Patent and Trademark Office*

UNITED STATES PATENT AND TRADEMARK OFFICE
CERTIFICATE OF CORRECTION

PATENT NO.    : 6,509,250 B2
DATED         : January 21, 2003
INVENTOR(S)   : J. Brett Rolfson et al.

It is certified that error appears in the above-identified patent and that said Letters Patent is hereby corrected as shown below:

Column 2,
Line 36, "800.degree. to 1100.degree. C." should read -- 800° to 1100° C. --

Signed and Sealed this

Fifth Day of April, 2005

JON W. DUDAS
*Director of the United States Patent and Trademark Office*